(12) United States Patent
Domalski

(10) Patent No.: US 6,429,656 B2
(45) Date of Patent: Aug. 6, 2002

(54) POLARIZING ANTENNA FOR A MAGNETIC RESONANCE APPARATUS

(75) Inventor: Stefan Domalski, Nuernberg-Maxfeld (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/824,373

(22) Filed: Apr. 2, 2001

(30) Foreign Application Priority Data

Mar. 31, 2000 (DE) .......................................... 100 16 229

(51) Int. Cl.$^7$ ................................................. G01V 3/00
(52) U.S. Cl. ...................................... 324/318; 324/322
(58) Field of Search ............................... 343/754, 756; 324/300, 314, 318, 309, 322

(56) References Cited

U.S. PATENT DOCUMENTS

| 4,924,868 A | 5/1990 | Krause et al. .............. 128/653 |
| 4,998,066 A | * 3/1991 | Wichern et al. ............. 324/322 |
| 5,075,624 A | * 12/1991 | Bezjak ........................ 324/318 |
| 5,296,813 A | * 3/1994 | Holmes et al. .............. 324/322 |
| 5,396,174 A | * 3/1995 | Hanke et al. ................ 324/318 |
| 5,594,337 A | * 1/1997 | Boskamp ..................... 324/318 |
| 5,952,830 A | * 9/1999 | Petropoulos et al. ....... 324/318 |
| 6,133,737 A | 10/2000 | Greim ......................... 324/318 |
| 6,317,091 B1 | * 11/2001 | Oppelt ......................... 343/742 |

* cited by examiner

*Primary Examiner*—Tho G. Phan
(74) *Attorney, Agent, or Firm*—Schiff Hardin & Waite

(57) ABSTRACT

A polarizing antenna for a magnetic resonance apparatus for irradiating an imaging volume surrounded by the antenna, has two or a multiple of two longitudinal conductors that are arranged with the same lateral spacing parallel to an axis and which are terminated with electrically coupled end rings. The size of the imaging volume is dependent on the distance of two end rings terminating the longitudinal conductors from one another. The longitudinal conductors have a number of end rings allocated to them, by which the longitudinal conductors can be terminated and that can be optionally switched into coupling connection with the longitudinal conductors for varying the illuminatable imaging volume.

29 Claims, 2 Drawing Sheets

POLARIZING ANTENNA FOR A MAGNETIC RESONANCE APPARATUS

BACKGROUND OF THE INVENTION

1. Field of the Invention

The present invention is directed to a polarizing antenna for a magnetic resonance apparatus for at least irradiating into an imaging volume surrounded by the antenna, of the type having two longitudinal conductors or a multiple thereof that are arranged parallel to an axis with the same lateral spacing and are terminated with electrically coupled end rings, with the size or the length of the imaging volume being dependent on the spacing of two end rings terminating the longitudinal conductors.

2. Description of the Prior Art

In magnetic resonance tomography, the quality of the diagnostics is dependent on obtaining an artifact-free image of the pathology in the region of interest, referred to as the "field of view". Dependent on the application, image acquisition areas of different sizes are needed. When only relatively small body regions are acquired such as, for example, parts of the head, the heart or a dislocated joint, then the region of interest is small, whereas a large imaging area is needed for acquiring the spinal column or in the framework of angiography exposures. Antennas of different sizes that enclose different imaging volumes within which an image can be acquired are employed for the implementation of these different examinations. This means that different magnetic resonance apparatus or accessory parts in the form of local antennas must be used for different examinations. Another problem is that, given employment of the antenna for reception of the radiofrequency signals as well, a large irradiation region has a negative influence on the signal-to-noise ratio. Volume coils that enclose the imaging volume or the field of view (for example, the brain cavity in fact image such a volume as well as possible. With a larger imaging volume, however, the volume coil receives a great deal of noise, which leads to a decrease of the signal-to-noise ratio and thus to a degradation of the image quality. Making the irradiation region, and thus the measurement volume, smaller, in contrast, leads to a clear enhancement of the signal-to-noise ratio, and thus to an improvement of the image quality, since the signals are influenced significantly less by basic noise. In comparison thereto, small antennas are optimized in view of the signal-to-noise ratio and a lower power consumption, but have only a small imaging volume. As a result of the antenna design, the examining physician is forced to employ a magnetic resonance apparatus with a large or small antenna—if available—dependent on the type of examination. When, for example, only a magnetic resonance apparatus having a large antenna is available on site, then the disadvantages in view of the noise and, possible image artifacts deriving from an examination of a relatively small region of interest must be accepted. Another goal in the framework of such examinations is to minimize the radiofrequency power emitted into the patient given optimized system power, and to not exceed the limit values for the absorption of radiofrequency energy, referred to as the "specific absorption rate" (SAR). Again limits are reached when a relatively small region of interest is to be examined but the existing antenna or volume coil covers a large imaging volume, since the patient is unnecessarily subjected to radiofrequency energy in regions outside the imaging volume that is actually required for the region of interest.

SUMMARY OF THE INVENTION

An object of the present invention is to provide a polarizing antenna of the type initially described that allows a flexible operation of a magnetic resonance apparatus to satisfy the different demands associated with different examinations.

This object is inventively achieved in a polarizing antenna of the type initially described wherein the longitudinal conductors have a number of end rings allocated to them with which the longitudinal conductors can be terminated in resonant fashion and that can be optionally connected in a resonant coupling connection with the longitudinal conductors for varying the imaging volume that can be irradiated.

The inventive antenna allows the size of the imaging volume to be varied by selectively connecting (cutting in) one or more end rings that terminate the longitudinal conductors. The attending physician thus can select the imaging volume in the way that is most expedient for the examination to be undertaken. There is thus the possibility of lengthening or shortening the antenna in steps dependent on the position of the end rings. The inventive antenna thus combines the advantages of a long antenna or volume coil with those of a short antenna or volume coil since the characteristic can be arbitrarily switched dependent on the application. The quantity of radiofrequency energy emitted into the patient can be minimized while simultaneously achieving a high image quality as a result of a suitable selection of the imaging volume required for the examination. An extremely flexible examination of the patient is thus available to the physician by a corresponding adaptation of the antenna design to the examination to be undertaken.

In an embodiment of the invention the end rings are arranged at a number of specific positions with reference to the longitudinal conductors. In this embodiment of the invention, the end rings are distributed along the length of the longitudinal conductors, i.e. the effective length of the longitudinal conductors can be varied by corresponding cut-in of one or two end rings between which the imaging volume is defined. Each connectable end ring can be composed of a number of transverse conductors that are arranged at the specific longitudinal positions between the longitudinal conductors and that can be coupled to the longitudinal conductors via switchable conductor connections. As needed, these transverse conductors of an end ring are coupled to the longitudinal conductors via the switchable connections and the termination of the longitudinal conductors is thus effected.

Inventively, the conductor connections be capacitor arrangements that form resonant locations and to which a switch means for opening and closing the connection is allocated. A resonant termination ensues in a simple way via the capacitor arrangements; the connection being opened or closed with the switch connecting or disconnecting for the end ring to the longitudinal conductors.

In one embodiment, the switch can be an impedance transformation circuit, with a separate switch allocated to each capacitor arrangement. This impedance transformation circuit, which is also called a $\lambda/4$ circuit, makes it possible either to switch the capacitor arrangement into resonance in order to switch the end ring into a terminating connection, or to cancel the resonant condition and decouple the end ring.

Alternatively, the switch can be fashioned as an electromechanical switch, with a separate electromechanical switch allocated to each capacitor arrangement or a central switch for opening and closing the connections can be provided for each end ring. In this embodiment, the line connections thus are electromechanically switched, either centrally or decentrally.

In another embodiment, the switch can be a semiconductor switch, with a separate semiconductor switch allocated to each capacitor arrangement. Alternatively, a central semiconductor switch can be provided for each end ring, via which the line connections are opened or closed. Expediently, semiconductor switches in the form of PIN diode switches are employed.

Inventively, switchable end rings can be exclusively employed, i.e., each end ring allocated to the longitudinal conductors can be coupled to the longitudinal conductors as needed, so that this can be terminated by the respective end ring. In this embodiment, thus, two end rings must be cut in for the termination. In an alternative embodiment the longitudinal conductors are terminated with a non-switchable end ring in the region of one end, with the imaging volume being defined between this and one of the switchable end rings arranged distributed along the length. In this embodiment. This is especially advantageous, for example, where mainly head exposures ensue. The imaging volume can be defined between a non-switchable end ring arranged at the longitudinal conductor end, this representing a fixed resonant termination, and a switchable end ring arranged distributed over the length. In the case of a head exposure, for example when only the brain is to be examined, the end ring lying closest to the fixed end ring is cut in. A neighboring end ring is cut in instead of the first for an exposure of the entire head. A third end ring is cut in for the termination when, for example, the neck region also is to be acquired. In this case as well, the non-switchable end ring can be composed of a number of transverse conductors arranged between the longitudinal conductors at a common end region, these being connected to the longitudinal conductors via capacitor arrangements, which form resonant locations; in this case, however, the connections are not switchable, as stated. It should be noted that exactly two end rings are always needed to function for imaging, one or both thereof being switchable, as described.

The above-described embodiment is designed as a high-pass antenna. An alternative design of the polarizing antenna, which, like the first embodiment functions as a linearly polarizing antenna given employment of two longitudinal conductors, and as a circularly polarizing antenna given employment of at least four longitudinal conductors, is designed as a low-pass antenna. In this low pass embodiment at least one end of the longitudinal conductors is connected to a first end ring that is in turn followed by at least one further, neighboring end ring, and the longitudinal conductors can be terminated via each of the end rings. In this embodiment, each longitudinal conductor is "lengthened" with end rings. In order to enable this, it is inventively provided that the first end ring is composed of a number of first and second transverse conductors arranged following one another in the circumferential direction. Each first transverse conductors are connected to a longitudinal conductor via a capacitor arrangement and to the second transverse conductors via a switchable line connection. This end ring, or every end ring, is composed of further first and second transverse conductors connected via switchable line connections, the first transverse conductors thereof being connected via further capacitor arrangements to the first transverse conductors of the preceding end ring. The capacitor arrangements are designed such that, dependent on the end ring that is cut in, the capacitor arrangements that are activated form the resonant capacitance. The longitudinal conductors, thus, are lengthened by the first transverse conductors of the respective end rings, with these first transverse conductors being connected to the longitudinal conductors or to one another via capacitor arrangements. These series-connected capacitor arrangements are designed such that the required resonant capacitance always occurs regardless of which end ring is cut in. The cut-in of the individual end rings ensues with the switchable connections between the first and second transverse conductors of each and every end ring. When, for example, the second end ring is to be cut in, then the connections of the first end ring are opened; only the first transverse conductors are coupled to the longitudinal conductors via the capacitor arrangements. At the second end ring, in contrast, the connections are closed, so that this end ring has a terminating connection to the longitudinal conductors. Of course, more than two end rings can be provided in the described way.

A separate switch can be provided in each switchable connection, or a central switch can be provided for the switchable connections of each and every switchable end ring. The switches can be mechanical switches or semiconductor switches, preferably in the form of PIN diode switches. As in the first embodiment, all switch types that enable a dependable and defined cut-in of an end ring can be employed.

Here as well, switchable end rings can be exclusively provided, i.e. both ends of the longitudinal conductors have a number of end rings in the above-described form. Alternatively the longitudinal conductors can be terminated with a non-switchable end ring in the region of one end, with the imaging volume being defined between this end ring and a switchable end ring provided at the other end.

Inventively, the longitudinal conductors and/or the transverse conductors can be fashioned as ribbon conductors or rod conductors. The conductors are arranged on a cylindrical surface, the cylinder of this surface coincides with the axis of a cylindrical imaging volume surrounded by the antenna.

Even though single-piece longitudinal conductors can be employed, it has proven expedient, for suppression any eddy currents that may be induced in the longitudinal conductors, for the longitudinal conductors to be composed of a number of conductor parts that are arranged parallel side-by-side and proceed in longitudinal direction, and that are connected via capacitor arrangements enabling a flow of high-frequency currents. The capacitor arrangements typically have a capacitance between 1 and 20 nF.

DESCRIPTION OF THE PREFERRED EMBODIMENTS

Figure 1:
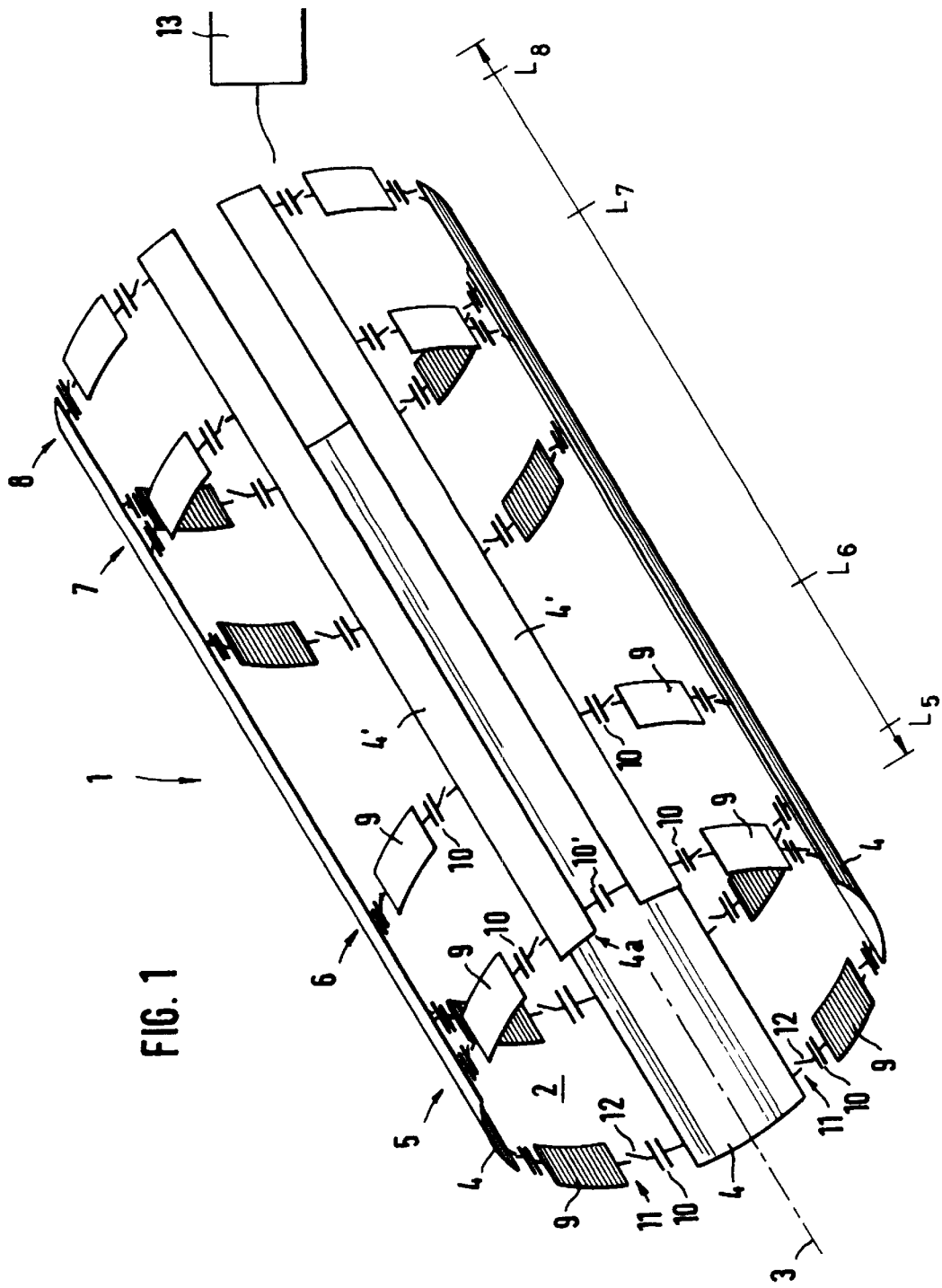
FIG. 1 is a schematic illustration of a first embodiment of an inventive antenna.

FIG. 1 shows a first embodiment of an inventive antenna 1, which is a circularly polarizing antenna that is fashioned as a volume antenna for a diagnostic magnetic resonance apparatus. The antenna 1 has a cylindrical structure and completely surrounds a body part to be examined, for example head or trunk or extremities. The antenna 1 is dimensioned such that the interior 2 it surrounds as an imaging volume has an optimally uniform sensitivity for the magnetic resonance signals provided within the body part to be examined. The antenna 1 is fashioned substantially symmetrical relative to an axis 3. As can be seen, the antenna 1 surrounds a cylindrical volume.

The antenna 1 is composed of four longitudinal conductors that are all of the same length L. The longitudinal conductors are arranged symmetrically around the axis 3 with the same spacing. The angular distance of the longitudinal conductors 4 from one another amounts to 90° in the illustrated example. Alternatively, to the arrangement of four longitudinal conductors shown in FIG. 1, it is also possible to provide, for example, eight or sixteen longitudinal conductors. If only two longitudinal conductors are provided, then the antenna represents a linearly polarizing antenna.

A total of four end rings 5, 6, 7, 8 are allocated to the longitudinal conductors 4, these being arranged at different positions $L_5$, $L_6$, $L_7$ and $L_8$ with reference to the length L of the longitudinal conductors. The number of longitudinal conductors can be arbitrarily selected. Each of the end rings 5, 6, 7, 8 serves for the termination of the longitudinal conductors 4 in order to vary the size of the effective imaging volume that is surrounded by the antenna 1. Each of the end rings 5, 6, 7, 8 is composed of transverse conductors 9 that are arranged between the longitudinal conductors at the selected positions $L_5$, $L_6$, $L_7$ and $L_8$ with the same spacing from the axis 3 as the longitudinal conductors 4. The transverse conductors 9 are coupled to the longitudinal conductors 4 via capacitor arrangements 10. The capacitor arrangements 10 respectively form resonant locations. In order to couple any arbitrary end ring 5, 6, 7, 8 to the longitudinal conductors such that it terminates the longitudinal conductor, each connection 11 via which a transverse conductor 9 is connected to a longitudinal conductor 4 has a switch 12 allocated to it with which the connection can be opened or closed. Dependent on the switch status, an end ring is connected so as to terminate the longitudinal conductors (switch 12 closed) or is uncoupled (switch 12 opened). The switch 12 can be an impedance transformation circuit ($\lambda/4$ circuit) with which the resonant condition can be set or cancelled by means of a coil and of an additional capacitor. Alternatively, the switch 12 can be an electromechanical switch or a semiconductor switch in the form of a PIN diode switch. Any switch that enables a defined opening and closing of the connection is employable. A central controller 13 is provided for the actuation of the switch 12, so that the end rings 5, 6, 7, 8 can be coupled or not via the controller 13. It is also possible to provide a central switch arrangement for each one of the end rings 5, 6, 7, 8 at the central controller 13, the connections being opened or closed thereby.

Dependent on the need, it is now possible for the attending physician to couple two end rings for the termination of the longitudinal conductors in an arbitrary way. When, for example, an examination of the spinal column is to be implemented, it is expedient to use the largest possible imaging volume. In this case, the end rings 5 and 8 are coupled, i.e. the respective switches 12 belonging to the end rings 5 and 8 are closed, whereas the switches 12 of the end rings 6 and 7 are opened. The imaging volume is thus defined by the positions of the end rings 5 and 8, or is dependent thereon.

When, for example, an examination of the head area is to ensue, it suffices to connect the two end rings 7 and 8, since only a relatively small imaging volume is required in this case. In this case, thus, the switches 12 of the end rings 7 and 8 are closed, whereas the switches 12 of the end rings 5 and 6 are opened.

Alternatively, it is possible to couple one of the end rings 5 or 8 in permanent termination with the longitudinal conductors, i.e. it is not switchable and no switches 12 are present at that end ring. In this case, the variable imaging volume thus always extends between the fixed end ring, i.e. for example the end ring 5, and one of the switchable end rings 6, 7, 8. In addition to the arrangement of four end rings shown in FIG. 1, of course, it is possible to provide more end rings in a middle length segment, these being capable of being coupled in the same way.

The longitudinal conductors 4 as well as the transverse conductors 9 are ribbon conductors that are fashioned of one piece. Solely as an example, FIG. 1 shows the possibility of being able to use slotted longitudinal conductors, as shown with the longitudinal conductor 4a. This is composed of two conductor parts 4' that are fashioned as ribbon conductors and extend over the full length L. The two conductor parts 4' are coupled with a capacitor arrangement 10' that has a capacitance in the range of a few nF. This design serves the purpose of avoiding possible eddy currents that have a disadvantageous effect on the image exposure and can be induced in the longitudinal conductors. The capacitor arrangement 10' enables the flow of high-frequency currents, whereas a flow of low-frequency eddy currents is suppressed. When slotted longitudinal conductors are utilized, then all employed longitudinal conductors are expediently fashioned in a corresponding way. It should be noted that more than two conductor parts 4' that are coupled via respective capacitor arrangements 10' are normally employed in such cases.

Figure 2:
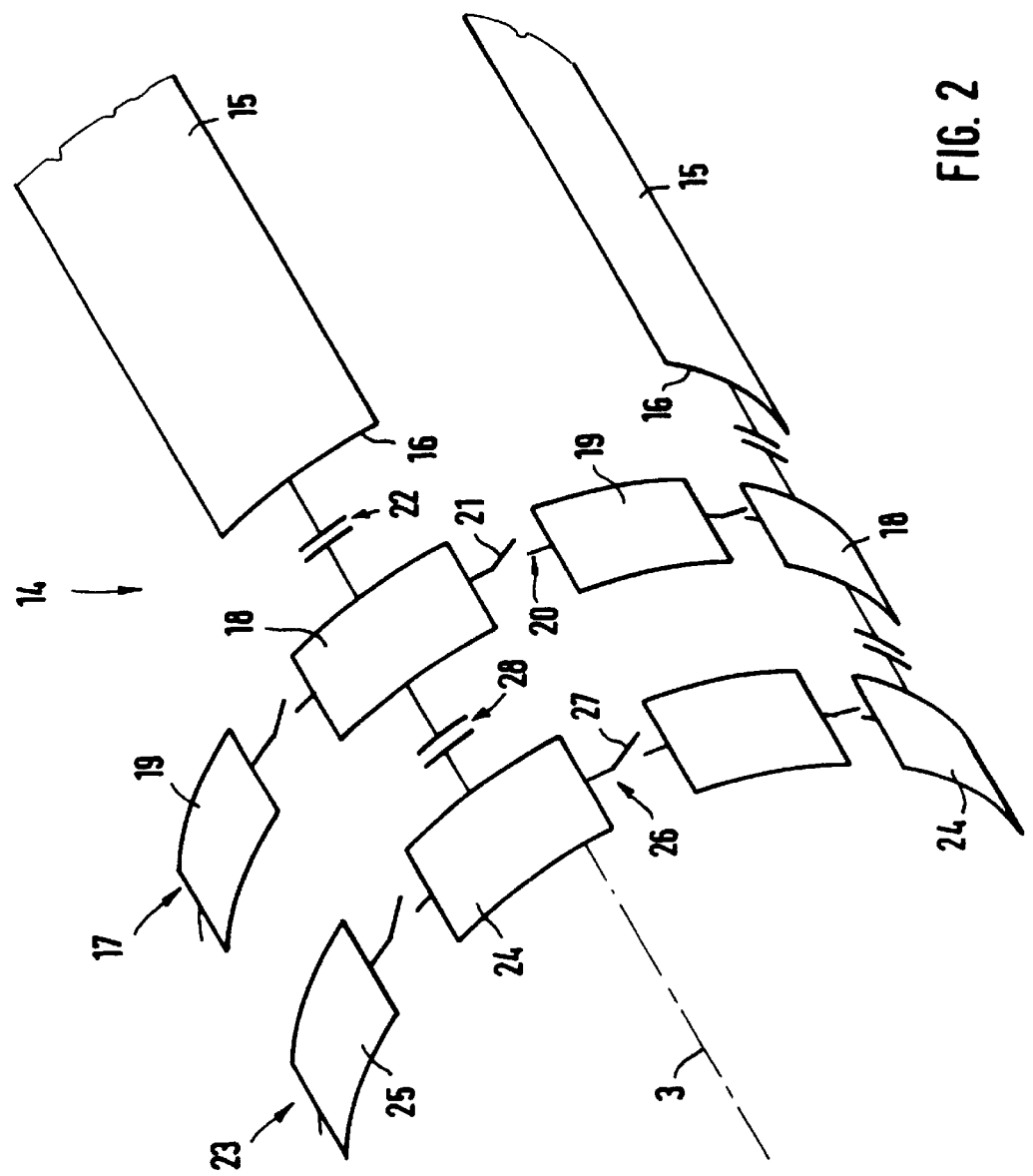
FIG. 2 is a schematic illustration for showing a portion of second embodiment of an inventive antenna.

Whereas the antenna shown in FIG. 1 is designed as a high-pass antenna, FIG. 2 shows an alternative embodiment of an antenna 14 that is implemented as a low-pass antenna. Only a portion of the antenna 14 is shown; the basic structure with the antenna elements cylindrically arranged around the axis 3 corresponds to that according to FIG. 1 in this respect. The same is true for the central controller 13.

A number of longitudinal conductors 15 are likewise present in the embodiment of FIG. 2, only two thereof being shown in the excerpt. The ends 16 of the longitudinal conductors 15 are coupled to a first end ring 17. The first end ring 17 is composed of first transverse conductors 18 as well as of second transverse conductors 19 that are arranged behind one another in circumferential direction. The first and second transverse conductors 18, 19 are connected to one another via switchable line connections 20, whereby each line connection in the illustrated example can be opened or closed via a switch 21. These switch 12 can be an electromechanical switch or a semiconductor switch that is arranged directly in the connection. There is also the possibility of opening or closing the connections 20 via respective central switch arrangement that are located at the central controller. Further, the first transverse conductors are connected to the ends of the longitudinal conductors 15 via first capacitor arrangements.

In the illustrated example, the first end ring 17 is followed by a second end ring 23 that is likewise composed of first transverse conductors 24 and second transverse conductors 25. These, too, are connected to one another via respective line connections 26 with suitable switches 27. The first transverse conductors 24 are again connected to the first transverse conductors 18 of the first end ring 17 via further capacitor arrangements 28. A third or fourth end ring can be added in a corresponding form.

When, for example, the termination is to ensue with the end ring 23, then the switches 27 are closed, i.e. the transverse conductors 24, 25 are connected to one another. In contrast, the switches 21 of the first end ring 17 are opened. In this case, the longitudinal conductors 15 are lengthened by of the first transverse conductors 18 and 24, the capacitor arrangements 22 and 28 serving this purpose. These capacitor arrangements 22, 28 are designed such that the respective resonant capacitances are set as a result of the series circuit of the arrangements, so that respective resonant locations are established. Here, too, the longitudinal conductors are fashioned as ribbon conductors, like the first and second transverse conductors, in order to homogenize the sensitivity distribution in the imaging volume and in order to realize a high degree of coverage in the circumferential direction with the longitudinal conductors.

FIG. 2 shows the inventive fashioning of an antenna 14 in the region of an end of the longitudinal conductors. At the opposite end, the longitudinal conductors can be terminated with an end ring that permanently termites the longitudinal conductors that, for example, can be fashioned of suitable, non-switched transverse conductors that are arranged between the longitudinal conductors, these transverse conductors are coupled to the longitudinal conductors via corresponding capacitor arrangements at resonant locations. In this embodiment, thus, the imaging volume is always defined between the permanently terminating end ring and one of the switchable end rings 17 and 23. Alternatively, there is the possibility of also providing a number of end rings at this end, so that an end ring for varying the size of the imaging volume can also be selectively cut in at that location.

Each of the inventive antennas 1, 14 is connected—via signal terminals that are not shown in detail—to a known radiofrequency system for generating radiofrequency pulses that the antenna converts into an alternating field for the excitation of atomic nuclei, as well as to a reception system for the reception and evaluation of the signals that proceed from alternating fields of the precessing nuclear spins picked up by the antenna. Since this system is known, it is not shown in detail for clarity.

Although modifications and changes may be suggested by those skilled in the art, it is the intention of the inventor to embody within the patent warranted hereon all changes and modifications as reasonably and properly come within the scope of his contribution to the art.

I claim as my invention:

1. A polarizing antenna for a magnetic resonance apparatus comprising:

a plurality of longitudinal conductors, said plurality being selected from the group consisting of two and multiples of two, proceding along a longitudinal axis and being equidistantly spaced from each other;

a plurality of end rings respectively disposed along said longitudinal conductors and proceeding substantially transverally to said longitudinal conductors, said plurality of end rings including switchable end rings; and a switch arrangement for selectively electrically coupling at least one of said switchable end rings to said longitudinal conductors to vary an irradiatable imaging volume defined by said at least one of said switchable end rings and one other end ring in said plurality of end rings, and respective lengths of said longitudinal conductors between said at least one switchable end ring and said one other of said end rings.

2. A polarizing antenna as claimed in claim 1, wherein said end rings in said plurality of end rings are respectively disposed at specified positions along a longitudinal length of said longitudinal conductors.

3. A polarizing antenna as claimed in claim 2 wherein each of switchable end rings comprises a plurality of transverse conductors respectively disposed between said longitudinal conductors at said specified positions, and wherein said switch arrangement comprises a plurality of line connections respectively disposed between said transverse conductors and said longitudinal conductors operable to selectively couple said transverse conductors to said longitudinal conductors.

4. A polarizing antenna as claimed in claim 3 wherein each of said line connections comprises a capacitor arrangement forming a resonant location connected to a switch operable to open and close the line connection.

5. A polarizing antenna as claimed in claim 4 wherein said switch is an impedance transformation circuit.

6. A polarizing antenna as claimed in claim 4 wherein said switch is a mechanical switch.

7. A polarizing antenna as claimed in claim 4, wherein said switch is a semiconductor switch.

8. A polarizing antenna as claimed in claim 7, wherein said semiconductor switch is a PIN diode switch.

9. A polarizing antenna as claimed in claim 3 wherein each of said line connections comprises a capacitor arrangement that forms a resonant location, and wherein each of said switchable end rings has a central semi-conductor switch for opening and closing all of the line connections in that end ring.

10. A polarizing antenna as claimed in claim 9 wherein said central semiconductor switch is a PIN diode switch.

11. A polarizing antenna as claimed in claim 1, wherein each of said end rings in said plurality of end rings is a switchable end ring.

12. A polarizing antenna as claimed in claim 1, wherein said longitudinal conductors have opposite ends, and wherein one end ring in said plurality of end rings is a non-switchable end ring electrically connected to said longitudinal conductors at one of said ends, and wherein said non-switchable end ring forms said one other of said end rings.

13. A polarizing antenna as claimed in claim 12 wherein non-switchable end ring comprises a plurality of transverse conductors disposed between said longitudinal conductors at one of said ends, said transverse conducts being electrically connected to said longitudinal conductors via a plurality of capacitor arrangements respectively forming resonance location.

14. A polarizing antenna as claimed in claim 1 wherein said longitudinal conductors have first and second opposite ends, and wherein said switchable end rings include at least a first switchable end ring and a second switchable end ring neighboring each other at said first end of said longitudinal conductors, either one of said first and second switchable end rings being electrically coupled to said longitudinal conductors by said switch arrangement to terminate said longitudinal conductors at said first end.

15. A polarizing antenna as claimed in claim 12 wherein each of said first and second switchable end rings comprises a plurality of alternating first and second transverse conductors, said first conductors of said first switchable end ring being respectively connected to said longitudinal conductors via respective capacitor arrangements and being connected to the second transverse conductors in the first switchable end ring via respective switchable line connections, and wherein said first transverse conductors of said second switchable end ring are respectively connected to said first transverse conductors of said first switchable end ring via respective further capacitor arrangements, and wherein said first and second transverse conductors of said second switchable end ring are connected to each other via respective switchable line connections, said switchable line connections in said first and second switchable end rings being respectively operable by said switch arrangement to selectively electrically couple one of said first and second switchable end rings to said longitudinal conductors to terminate said longitudinal conductors, with said capacitor arrangements forming resonant locations.

16. A polarizing antenna as claimed in claim 15 wherein each of said line connections comprises a switch.

17. A polarizing antenna as claimed in claim 16 wherein each of said switches is a mechanical switch.

18. A polarizing antenna as claimed in claim 16 wherein each of said switches is a semi-conductor switch.

19. A polarizing antenna as claimed in claim 18 wherein each of said semiconductor switches is a PIN diode switch.

20. A polarizing antenna as claimed in claim 15 wherein each of said first and second switchable end rings has a central switch for switching all of the switchable line connections in that end ring.

21. A polarizing antenna as claimed in claim 20 wherein said central switch is a semi-conductor switch.

22. A polarizing antenna as claimed in claim 21 wherein said semi-conductor switch is a PIN diode switch.

23. A polarizing antenna as claimed in claim 14 wherein each of said end rings in said plurality of end rings is a switchable end ring.

24. A polarizing antenna as claimed in claim 14 wherein said plurality of end rings includes one non-switchable end ring electrically connected to said longitudinal conductors at said second end, and forming said one other of said end rings.

25. A polarizing antenna as claimed in claim 1 wherein said longitudinal conductors comprise conductors selected from the group consisting of ribbon conductors and rod conductors.

26. A polarizing antenna as claimed in claim 1 wherein each of said switchable end rings comprises a plurality of transverse conductors, and wherein said transverse conductors are conductors selected from the group consisting of ribbon conductors and rod conductors.

27. A polarizing antenna as claimed in claim 1 wherein said longitudinal conductors are disposed on a cylindrical surface having a cylinder axis coinciding with said longitudinal axis.

28. A polarizing antenna as claimed in claim 1 wherein each of said longitudinal conductors is a one-piece conductor.

29. A polarizing antenna as claimed in claim 1 wherein each of said longitudinal conductors a comprises a plurality of conductor parts disposed parallel to each other and proceeding in a longitudinal direction, the conductor parts of each longitudinal conductor being connected to each other via capacitor arrangements allowing flow of high-frequency currents between the conductor parts connected by the capacitor arrangements.

* * * * *